(12) United States Patent
Thakur (10) Patent No.: US 7,217,614 B2
(45) Date of Patent: May 15, 2007

(54) METHODS TO FORM ELECTRONIC DEVICES AND METHODS TO FORM A MATERIAL OVER A SEMICONDUCTIVE SUBSTRATE

(75) Inventor: Randhir P.S. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 464 days.

(21) Appl. No.: 10/338,523

(22) Filed: Jan. 7, 2003

(65) Prior Publication Data

US 2003/0113968 A1 Jun. 19, 2003

Related U.S. Application Data

(63) Continuation of application No. 09/138,773, filed on Aug. 24, 1998, now Pat. No. 6,528,364.

(51) Int. Cl.
*H01L 21/8234* (2006.01)
*H01L 21/8244* (2006.01)
*H01L 21/31* (2006.01)

(52) U.S. Cl. .................. 438/238; 438/239; 438/396; 438/782; 257/E21.008; 257/E21.647; 257/E21.267

(58) Field of Classification Search ............... 438/238, 438/239, 396, 782; 257/E21.008, E21.647, 257/E21.267
See application file for complete search history.

(56) References Cited

U.S. PATENT DOCUMENTS 3,895,976 A 7/1975 Dumas (Continued)

OTHER PUBLICATIONS

Jeon, Yongjoo, et al., "Effect of Barrier Layer on the Electrical and Reliability Characteristics of High-k Gate Dielectric Films", IEEE, pp. 29.6.1 (1998).

(Continued)

*Primary Examiner*—Michael Lebentritt
*Assistant Examiner*—Ron Pompey
(74) *Attorney, Agent, or Firm*—Wells St. John P.S.

(57) ABSTRACT

A first electrode and a doped oxide layer laterally proximate thereof are provided over a substrate. A silicon nitride layer is formed over both the doped oxide layer and the first electrode to a thickness of no greater than 80 Angstroms over at least the first electrode by low pressure chemical vapor deposition using feed gases comprising a silicon hydride, $H_2$ and ammonia. The substrate with silicon nitride layer is exposed to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing. A second electrode is formed over the silicon dioxide layer and the first electrode.

In one implementation, the chemical vapor depositing comprises feed gases of a silicon hydride and ammonia, with the depositing comprising increasing internal reactor temperature from below 500° C. to a maximum deposition temperature above 600° C. and starting feed of the silicon hydride into the reactor at a temperature less than or equal to 600° C. In one implementation the depositing comprises increasing internal reactor temperature from below 500° C. to a maximum deposition temperature above 600° C. using a temperature ramp rate of at least 10° C./minute from at least 500° C. to at least 600° C. Other aspects and implementations are described.

29 Claims, 3 Drawing Sheets

U.S. PATENT DOCUMENTS

| | | |
|---|---|---|
| 4,659,413 A | 4/1987 | Davis et al. |
| 4,758,528 A | 7/1988 | Goth et al. |
| 4,760,005 A * | 7/1988 | Pai ............................ 430/65 |
| 4,907,046 A | 3/1990 | Ohji et al. |
| 5,023,750 A | 6/1991 | Hirayama |
| 5,030,476 A | 7/1991 | Okamura et al. |
| 5,275,976 A | 1/1994 | Moslehi |
| 5,371,039 A | 12/1994 | Oguro |
| 5,376,593 A | 12/1994 | Sandhu et al. |
| 5,397,748 A | 3/1995 | Wantanabe et al. |
| 5,407,755 A | 4/1995 | Brucker et al. |
| 5,432,626 A | 7/1995 | Sasuga et al. |
| 5,523,596 A | 6/1996 | Ohi et al. |
| 5,587,614 A | 12/1996 | Hwang et al. |
| 5,604,658 A | 2/1997 | Pedder |
| 5,624,865 A | 4/1997 | Schuegraf et al. |
| 5,629,043 A | 5/1997 | Inaba |
| 5,663,087 A | 9/1997 | Yokozawa |
| 5,670,431 A | 9/1997 | Huanga et al. |
| 5,702,988 A | 12/1997 | Liang |
| 5,776,809 A | 7/1998 | Schufraf |
| 5,976,990 A | 11/1999 | Mercaldi et al. |
| 6,002,202 A | 12/1999 | Meyer et al. |
| 6,022,751 A | 2/2000 | Shindo et al. |
| 6,071,771 A | 6/2000 | Schuefraf |
| 6,087,231 A | 7/2000 | Xiang et al. |
| 6,100,188 A * | 8/2000 | Lu et al. ..................... 438/653 |
| 6,146,959 A | 11/2000 | DeBoer et al. |
| 6,204,142 B1 | 3/2001 | Thakur |
| 6,207,488 B1 | 3/2001 | Hwang et al. |
| 6,225,157 B1 | 5/2001 | Thakur et al. |
| 6,228,737 B1 | 5/2001 | Inhoue |
| 6,258,690 B1 | 7/2001 | Zenke |
| 6,316,308 B1 | 11/2001 | Thakur |
| 6,383,875 B1 | 5/2002 | Thakur |
| 6,436,847 B1 | 8/2002 | Thakur |
| 2002/0127763 A1 | 9/2002 | Arafa et al. |

OTHER PUBLICATIONS

Thakur, R.P.S., et al., "Rapid Thermal Processing—Manufacturing Perspective", *Mat. Res. Soc. Symp. Proc.*, Materials Research Society, vol. 387 (1995).

DeBoer, S.J., et al., "Thin Nitride Films: Pushing The Limits Using Rapid Thermal Processing", *Mat. Res. Soc. Symp. Proc.*, Materials Research Society, vol. 429 (1996).

* cited by examiner

_FIG. 1_

_FIG. 2_

METHODS TO FORM ELECTRONIC DEVICES AND METHODS TO FORM A MATERIAL OVER A SEMICONDUCTIVE SUBSTRATE

RELATED PATENT DATA

This patent resulted from a divisional application of U.S. patent application Ser. No. 09/138,773, filed on Aug. 24, 1998.

TECHNICAL FIELD

This invention relates to methods to form electronic devices, for example capacitors, antifuses, transistor gate and other constructions, and to methods to form a material over a semiconductive substrate.

BACKGROUND OF THE INVENTION

As the density of DRAM cells increases, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature sizes continue to become smaller and smaller, development of improved materials for cell dielectrics as well as the cell design and structure become important. The feature size of higher density DRAMS, for example 256 Mb, will be on the order of 0.25 micron and less. Such overall reduction in cell size drives the thickness of the capacitor dielectric layer to smaller values, and conventional capacitor dielectric materials such as $SiO_2$ and $Si_3N_4$ might become unsuitable. However it would be desirable to utilize silicon oxides and nitrides in spite of the reduced thicknesses due to the ease of use and available thorough understanding to integrate these materials in DRAM process flows. Yet processing associated with chemical vapor deposition of thin silicon nitride films in certain environments has also created other problems not directly associated with the capacitors.

For example, one prior art technique is the fabrication of stacked capacitors in a container shape within a borophosphosilicate glass layer (BPSG) to form the storage capacitors in DRAM circuitry. Here, a container opening is formed in a planarized layer of BPSG over a desired node location, typically in the form of a conductive polysilicon plug. The conductive electrode material is deposited to less than completely fill the opening, and then is typically chemical-mechanically polished back to provide a storage node electrode inside of the BPSG opening in the shape of a cup or container. Capacitor dielectric material is then provided over the storage node container, followed by deposition of a conductive cell plate layer which is subsequently patterned.

As circuitry integration and density increases, the corresponding dimensions and thicknesses of the various components also decreases. A typical capacitor dielectric layer in the above construction comprises a silicon dioxide/silicon nitride/silicon dioxide composite (ONO). The first oxide layer formed over the storage node electrode is typically native oxide formed by exposure of the exposed storage node material to ambient air. Silicon nitride is next chemical vapor deposited, for example utilizing a silicon hydride such as dichlorosilane and ammonia. Typical deposition conditions are at sub-Torr pressures and temperatures at or above 680° C., more typically above 700° C. The deposition process and the very thin nature of the typically deposited silicon nitride layer results in pin holes or other defects in the deposited layer. This is typically cured by a dense re-oxidation process which forms the outer silicon dioxide layer of the ONO construction. The prior art re-oxidation conditions for forming this outer oxide layer are conducted wet or dry at a temperature of from 800° C. to 950° C. at atmospheric pressure for from 5 to 30 minutes. Subsequently, a conductive cell plate layer is deposited and patterned over the ONO dielectric layer(s).

However as the nitride thickness of the ONO construction over the storage node electrode fell to below 80 Angstroms, it was discovered that the underlying bulk silicon substrate was oxidizing to the point of circuit destruction. BPSG is known to be extremely diffusive to oxidizing components during the above-described re-oxidation conditions. Silicon nitride, on the other hand, is known to form a good barrier layer to diffusion of such oxidizing gases under such conditions. Yet, the silicon nitride deposited over the BPSG in conjunction with the capacitor dielectric layer formation was apparently inadequate in shielding oxidation of substrate material underlying the BPSG when the deposited silicon nitride layer thickness for the capacitors fell below 80 Angstroms.

The invention was principally motivated with respect to overcoming this problem to enable silicon nitride to continue to be utilized as a capacitor dielectric layer where its thickness fell to below 80 Angstroms in deposition also occurring over a doped oxide layer, such as BPSG.

SUMMARY OF THE INVENTION

The invention comprises forming electronic devices, such as capacitors, antifuses, transistor gate and other constructions, and to methods of forming a material over a semiconductive substrate. In but one implementation, a first electrode and a doped oxide layer laterally proximate thereof are provided over a substrate. A silicon nitride layer is formed over both the doped oxide layer and the first electrode to a thickness of no greater than 80 Angstroms over at least the first electrode by low pressure chemical vapor deposition using feed gases comprising a silicon hydride, $H_2$ and ammonia. The substrate with silicon nitride layer is exposed to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing. A second electrode is formed over the silicon dioxide layer and the first electrode.

In one implementation, the chemical vapor depositing comprises feed gases of a silicon hydride and ammonia, with the depositing comprising increasing internal reactor temperature from below 500° C. to a maximum deposition temperature above 600° C. and starting feed of the silicon hydride into the reactor at a temperature less than or equal to 600° C. In one implementation the depositing comprises increasing internal reactor temperature from below 500° C. to a maximum deposition temperature above 600° C. using a temperature ramp rate of at least 10° C./minute from at least 500° C. to at least 600° C. In preferred implementations, the substrate is rotating during deposition, with the depositing comprising increasing internal reactor temperature from below 500° C. to a maximum deposition temperature above 600° C. and starting the substrate to rotate prior to reaching the maximum deposition temperature. In one implementation, rotation rate of the substrate is reduced upon substantially ceasing flow of at least one reactant gas to the reactor. In one implementation, rotation rate of the substrate is reduced within 1 minute of substantially ceasing flow of the at least one reactant gas to the reactor.

In one implementation, an inert cooling gas is flowed through a chemical vapor deposition reactor to cool a substrate and deposited material after the deposition.

In one implementation, a doped oxide layer is provided over a substrate. The doped oxide layer is chemical-mechanical polished. After the chemical-mechanical polishing, the doped oxide layer is caused to flow in a process comprising at least two steps. A prior in time of the steps comprises an inert atmosphere at a temperature of at least about 700° C. A later in time of the steps comprises an ammonia comprising atmosphere at a temperature of at least about 700° C. and forms a silicon nitride layer over the doped oxide layer.

Other aspects and implementations are described below.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been recognized that the chemical vapor deposition of silicon nitride utilizing silicon hydride gases and ammonia occurs at different rates over the storage node electrode of a DRAM capacitor (including any thin oxide formed thereover) and doped oxides. Specifically, such deposition of silicon nitride is largely selective to the storage node (typically polysilicon), and regardless is at a considerably greater growth rate than what occurs over the BPSG or other doped oxide layers. Accordingly, as the silicon nitride layer thickness over the storage node fell to below 80 Angstroms, an apparent lesser quantity growing over the doped oxide layer resulted in a layer too thin to achieve the barrier layer effect during the subsequent re-oxidation to form the outer oxide layer of the capacitor dielectric ONO composite. Several processing solutions in accordance with the invention have been developed.

Figure 1:
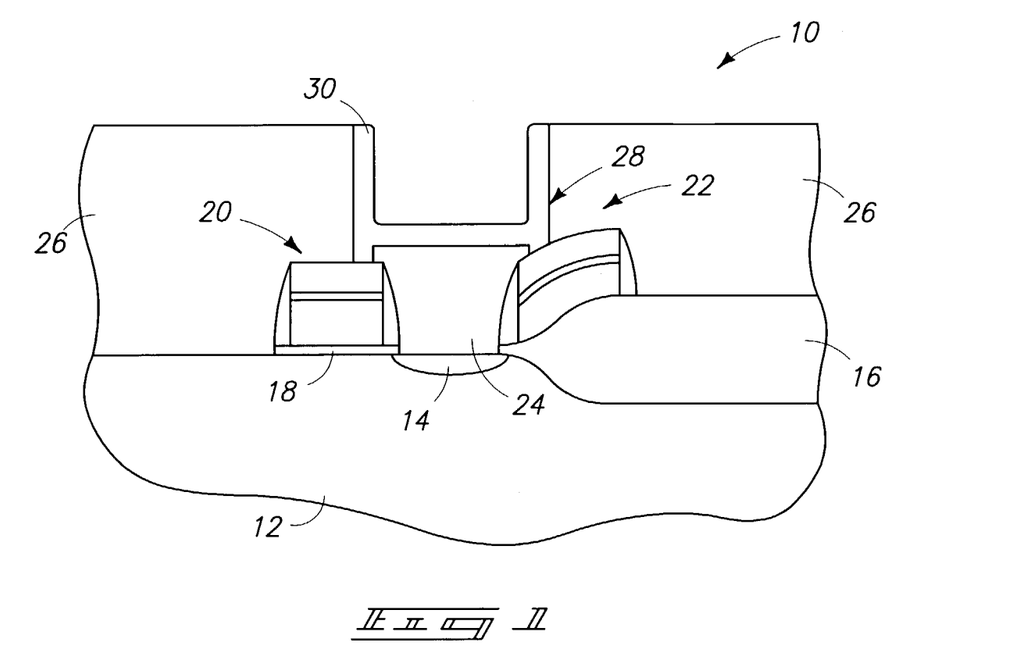
FIG. 1 is a diagrammatic view of a semiconductor wafer fragment at one processing step in accordance with the invention.

Referring to FIG. 1, a semiconductor wafer fragment or substrate is indicated generally with reference numeral 10.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Fragment 10 comprises a bulk monocrystalline silicon substrate 12 having a diffusion region 14 formed therein. Field oxide region 16 and a gate oxide layer 18 are formed over bulk substrate 12. A pair of word lines 20 and 22 are formed on opposing sides of diffusion region 14. A conductive polysilicon plug 24 is provided over and in electrical connection with diffusion region 14. A layer 26 of doped oxide, preferably BPSG, is provided over the illustrated component, and formed to have a container storage node opening 28 provided therein over plug 24. A conductively doped, and preferably hemispherical grain, polysilicon layer has been formed over the substrate to within container opening 28. Such has been planarized back to form the illustrated isolated first capacitor electrode 30, with doped oxide layer 26 being positioned laterally proximate thereof.

Figure 2:
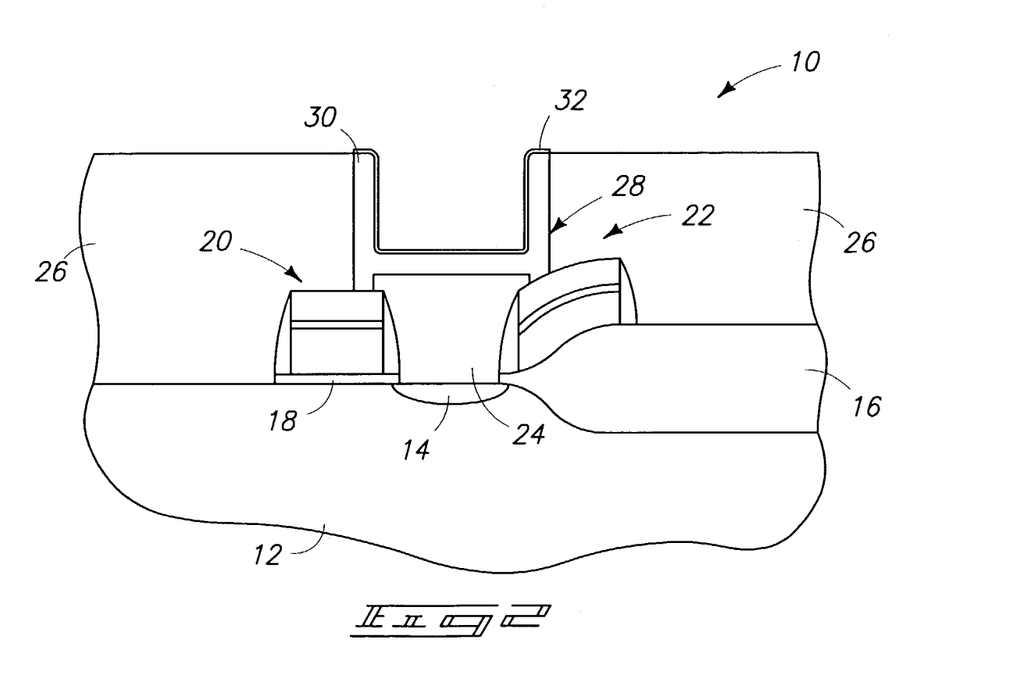
FIG. 2 is a view of the FIG. 1 wafer at a processing step subsequent to that depicted by FIG. 1.

Referring to FIG. 2, a silicon dioxide layer 32 can be formed on first capacitor electrode 30, such as by exposing the substrate to ambient air to form a native oxide layer or by CVD or other deposition. Regardless, an exemplary thickness for layer 32 is 20 Angstroms. A silicon nitride layer will subsequently be formed, as described below.

Figure 3:
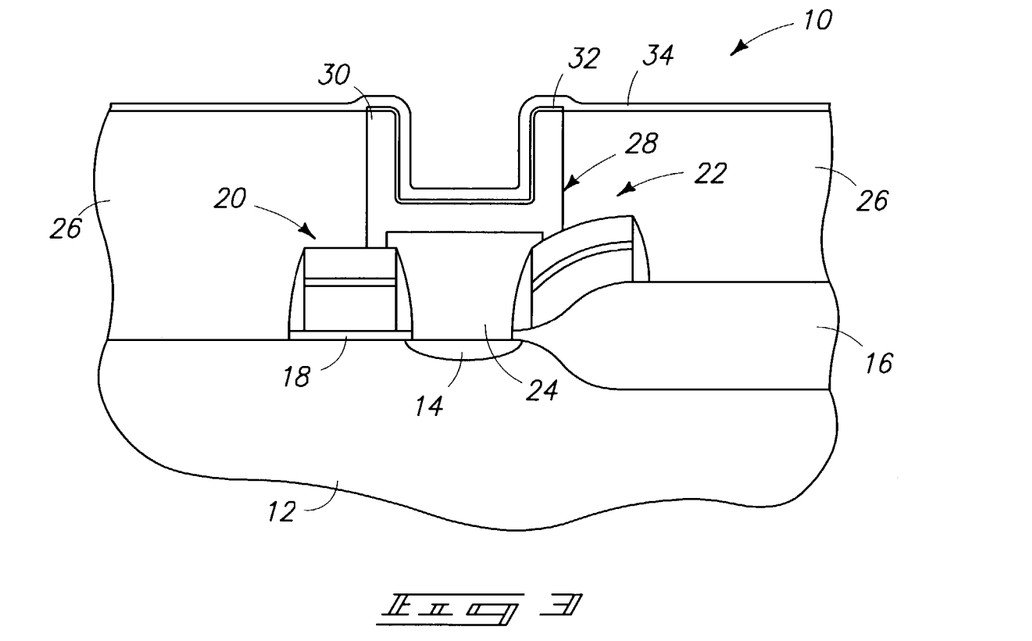
FIG. 3 is a view of the FIG. 1 wafer at a processing step subsequent to that depicted by FIG. 2.

Referring to FIG. 3, a silicon nitride layer 34 is formed over both doped oxide layer 26 and first capacitor electrode 30 to a thickness of no greater than 80 Angstroms over at least first capacitor electrode 30. Several aspects and implementations for forming layer 34 are possible as described below. Various of the implementations could be utilized alone or in any combination with other implementations as will be appreciated by the artisan. Further, such can incorporate any of the methods and implementations described in U.S. patent application Ser. No.09/138,950 by Randhir P. S. Thakur, entitled "Methods of Forming Electronic Devices" and filed commensurate with the filing of this application, and which is hereby incorporated by reference.

Provision of layer 34 preferably comprises chemical vapor deposition using feed gases comprising a silicon hydride and ammonia, and more preferably low pressure chemical vapor deposition which is substantially void of plasma. In the context of this document, "low pressure chemical vapor deposition" is intended to define any chemical vapor deposition process occurring at or below 700 Torr. Processing in accordance with the above identified application filed on the same date as this application, and in accordance with this application, is intended to result in less selectivity of the deposition between exposed polysilicon (or thin oxide formed thereover) and undoped oxide of layer 26. Accordingly, a suitably thick layer 34 is intended to be deposited over the doped oxide to effectively preclude oxidation of oxidizable material beneath layer 26 during a subsequent, oxidation of the silicon nitride layer. Layer 34 will also typically deposit to a thickness of less than 80 Angstroms over doped oxide layer 26, and still perhaps to a thickness lower than the thickness of the silicon nitride layer deposited over first capacitor electrode 30. Further, silicon nitride layer formation over first capacitor electrode 30 can be to a thickness of no greater than 60 Angstroms in accordance with a desired capacitor construction.

As shown, first capacitor electrode 30 is not outwardly exposed during the formation of silicon nitride layer 34 thereover, rather being covered by oxide layer 32. Alternately and perhaps more preferred, first capacitor electrode 30 is void of layer 32, and is outwardly exposed during the formation of the silicon nitride layer 34 thereover, with the silicon nitride layer being formed on doped first capacitor electrode 30. Also as shown and preferred, the silicon nitride layer forms on the doped oxide layer as opposed to on any intervening layer.

In but one implementation for depositing silicon nitride layer 34, internal reactor temperature is increased from below 500° C. to some maximum deposition temperature above 600° C., with the starting of the feed of the silicon hydride into the reactor occurring at some temperature less than or equal to 600° C. Preferred pressure during processing is from 1000 to 2000 Torr, with the preferred maximum deposition temperature being 600° C. Typical prior art processing achieves a maximum deposition temperature of between 640° C. and 700° C., where ammonia flow is initially provided with the flow of dichlorosilane and does not occur until maximum deposition temperature is reached. Starting the feed of silicon hydride into the reactor at a temperature of less than or equal to about 600° C. in accordance with an aspect of the invention facilitates nitride layer deposition and reduction in the selectivity of such deposition relative to polysilicon or undoped oxide as compared to doped oxide layer 26. More preferably, feed of the silicon hydride into the reactor is started at a temperature of less than or equal to 550° C., with less than or equal to 500° C. being even more preferred. Ammonia feed to the reactor also preferably occurs at a temperature of less than or equal to 600° C. The temperature then preferably ramps continuously upward to achieve the maximum deposition temperature.

In one implementation, the depositing comprises increasing internal reactor temperature from below 500° C. to a maximum deposition temperature above 600° C. using a temperature ramp rate of greater than 10° C./min from at least 500° C. to at least 600° C. The temperature ramp rate is preferably no greater than 100° C./min from at least 500° C. to at least 600° C. Preferably, the temperature ramp rate of greater than 10° C./min starts from a temperature below 500° C. and continues to a temperature above 600° C., and more preferably continues until reaching the maximum deposition temperature. Prior art processing achieves a temperature ramp rate up to the maximum deposition temperature of between 8° C. to 10° C. per minute. Increasing the ramp rate above 10° C. achieves an unexpected result of less selectivity in the silicon nitride layer deposition, and achieving better radial uniformity across a wafer surface during the deposition.

In another implementation, the substrate is rotating during deposition and is started to rotate prior to reaching a maximum deposition temperature above 600° C. Preferably, the substrate is started to rotate prior to the reactor temperature reaching 600° C., and upon commencing initial feed of the silicon hydride to the reactor at below 600° C. A preferred wafer rotation speed is from 5 to 10 rpm. In the prior art deposition, wafer rotation wasn't commenced until achieving a maximum deposition temperature of at least 640° C. and immediately prior to or commensurate with reactant gas injection. Commencing rotation in accordance with this implementation of the invention achieves less selectivity in the deposition and more radial uniformity in the deposition across the substrate.

In another implementation, rotation rate of the substrate is reduced upon substantially ceasing flow of at least one of the silicon hydride and ammonia to the reactor at the substantial conclusion of the deposition. An example rotation rate range during depositing and after a speed reduction is from about 3 rpm to 15 rpm. The rotation rate is preferably reduced by at least 50% to 70% of that rate immediately prior to substantially ceasing flow of the at least one of the silicon hydride and ammonia to the reactor. Also preferably, the reducing is to some constant layer rate which is maintained for at least 1 to 2 minutes, such as during initial wafer cooling. The rotation rate is preferably reduced upon substantially ceasing flow of the silicon hydride to the reactor, which is also preferably commensurate with ceasing flow of the ammonia to the reactor.

In one implementation, rotation rate of the substrate is reduced within 1–2 minutes of substantially ceasing flow of at least one of the silicon hydride and ammonia to the reactor. More preferably, such rotation reduction occurs within 30 to 60 seconds of the flow stoppage. Reducing can occur before or after substantially ceasing flow of at least one of the reactant gases, and preferably occurs upon/commensurate with ceasing flow of at least one of the reactant gases as described above. The prior is understood to maintain a constant rotation rate of about 5 rpm upon reaching maximum deposition temperature and continuing such rate after ceasing flow of the reactant gases and throughout cooling of the wafers. Processing in accordance with the immediately above-described preferred implementations has the effect of improving the radial uniformity across the wafer during deposition. Rotation facilitates control of depletion of the reactant species across the wafer and across the load.

In accordance with another implementation, low pressure chemical vapor deposition of layer 34 utilizes feed gases comprising a silicon hydride, $H_2$ and ammonia. The $H_2$ is preferably injected to within the reactor during the deposition as an $N_2/H_2$ mix. The $H_2$ is preferably added in addition to existing preferred flows of ammonia and silane at a preferred 3:1 or greater volumetric ratio. The prior art has not provided a separate feed of $H_2$ gas to the reactor. Provision of such in accordance with this implementation achieves less selectivity in the silicon nitride layer deposition and more radial uniformity in the deposition across the wafer.

Figure 6:
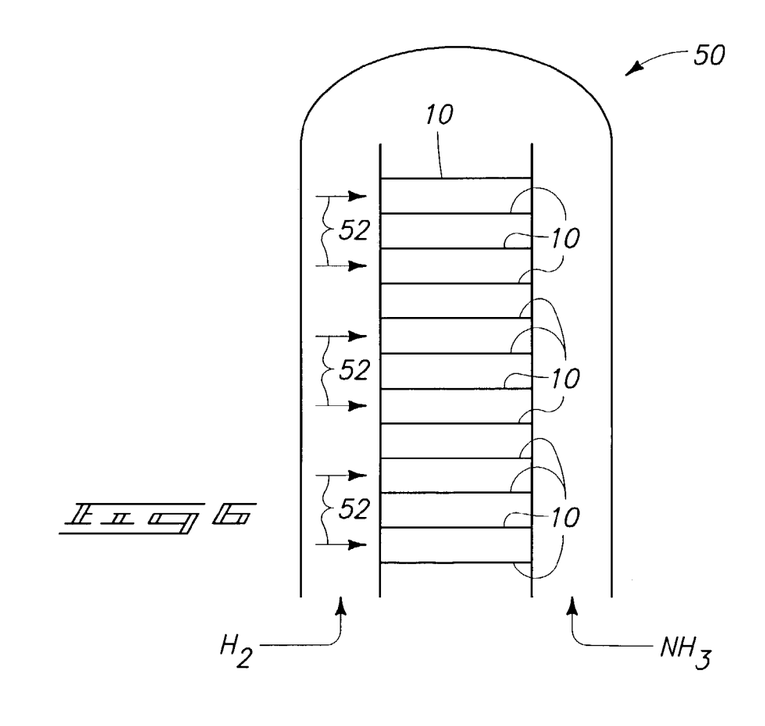
FIG. 6 is a diagrammatic depiction of a hot wall, vertical chemical vapor deposition reactor usable in a process in accordance with the invention.

A further considered deposition process for layer 35 is described with reference to FIG. 6. This depicts a vertical, hot wall chemical vapor deposition reactor 50 having a plurality of substrates 10 oriented horizontally therein. Chemical vapor depositing in accordance with this aspect of the invention comprises injecting silicon hydride to within the reactor at multiple spaced locations 52, positioned proximate spaced wafers of the plurality of wafers being deposited upon. Ammonia and $H_2$ can also be injected from multiple locations, but are preferably injected to within the reactor at only single respective locations, as shown. The prior art processing and provision of dichlorosilane to the reactor in conjunction with the silicon nitride layer deposition having the problems to which this invention is directed to overcoming only provides silane injection at/from a single location at the bottom of the reactor. Provision of the less mobile silicon hydride from multiple spaced locations positioned proximate spaced wafers within the reactor has the effect of achieving less selectivity in the nitride layer deposition, and potentially more radial uniformity in the deposition across the wafer.

In accordance with another implementation, the doped oxide layer is caused to flow in a process comprising at least two steps. The flowing is preferably conducted after all chemical-mechanical polishing or other removal processes has occurred relative to the outermost surface of layer 26. A prior in time of the flowing steps comprises an inert atmosphere at a temperature of at least about 700° C. Preferred conditions are flowing $N_2$ and/or Ar at a temperature of from about 950° C. to 1050° C. at atmospheric pressure for from about 10 to 30 seconds. A later in time of the steps comprises feeding ammonia at a temperature of at least 700° C. which forms a silicon nitride layer at least over doped oxide layer 26. Preferred temperature, pressure and time of processing conditions are as immediately described above with respect to the inert atmosphere. Such flow/reflow processing in accordance with the invention will either form a suitably thick silicon nitride layer to preclude oxidation of substrate material beneath oxide layer 26 during later processing, or at least form a suitably thick initiating seed layer for achieving a suitably thick silicon nitride layer by subsequent deposition for complete fabrication of silicon nitride layer 34. Flowing of doped oxide layer 26 might also be conducted prior to chemical-mechanical polishing or any other planarizing of the outer surface thereof.

In accordance with another implementation and at the conclusion of the deposition, an inert cooling gas is flowed through the reactor to cool the substrate and deposited material. Preferably, pressure within the reactor during such cooling is greater than one atmosphere. Prior art processes for cooling the wafers flow cooling gas externally of the reactor to cool the reactor walls, which ultimately results in wafer cooling. Flowing an inert cooling gas directly through the reactor to cool the substrate and deposited silicon nitride layer achieves more radial uniformity in such layer across the wafer.

Figure 4:
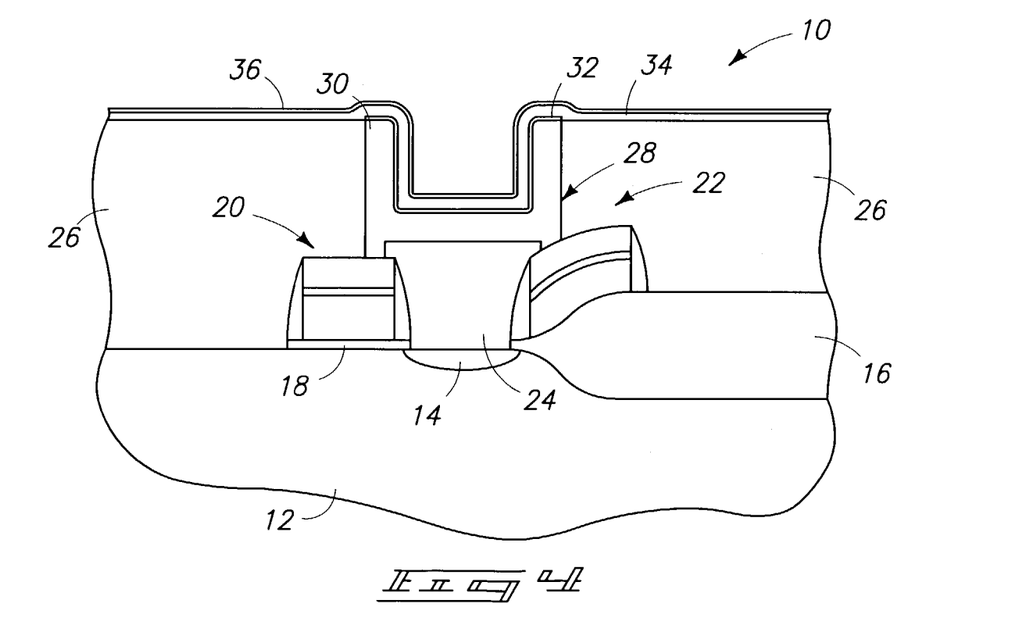
FIG. 4 is a view of the FIG. 1 wafer at a processing step subsequent to that depicted by FIG. 3.

Referring again to FIG. 4, the substrate is exposed to oxidizing conditions comprising at least 700° C. to form a silicon dioxide comprising layer 36 over silicon nitride layer 34. The thickness of silicon nitride layer 34 over doped oxide layer 26 is sufficient to shield oxidizable substrate material beneath doped oxide layer 26 (i.e., bulk substrate material 12) from oxidizing during the re-oxidation exposure. An example and preferred thickness for layer 36 is from 10 to 15 Angstroms on the nitride surface. Example wet oxidation conditions (i.e., in the presence of steam) or dry oxidation conditions (i.e., in the presence of oxygen) include exposure at from 800° C.–950° C. in an atmospheric furnace for from 5 to 30 minutes.

Figure 5:
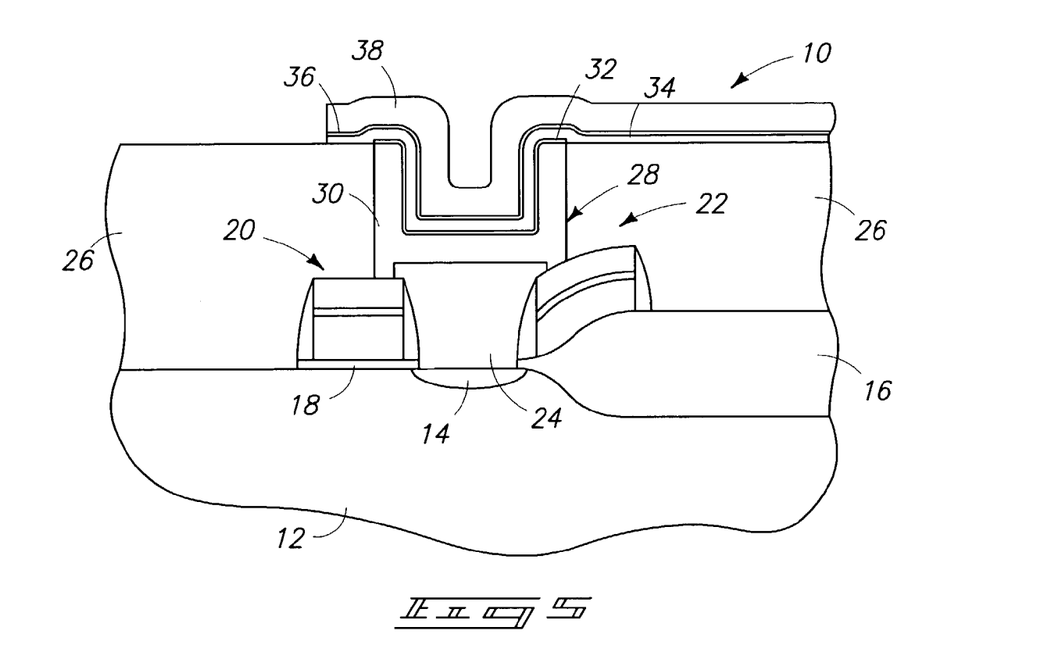
FIG. 5 is a view of the FIG. 1 wafer at a processing step subsequent to that depicted by FIG. 4.

Referring to FIG. 5, a second capacitor electrode layer 38 (i.e., conductively doped polysilicon) is deposited and patterned to form a second capacitor electrode over silicon dioxide layer 36 and first capacitor electrode 30. Such provides but one example method in accordance with the invention for producing an adequately thick layer of silicon nitride over BPSG layer 26 in spite of thickness of such layer at least over storage node layer 30 being less than 80 Angstroms thick.

Again, the invention was principally motivated from problems associated with capacitor fabrication where silicon nitride layer thickness in an ONO construction fell below 80 Angstroms, with the substrate also comprising outwardly exposed boron and/or phosphorus doped silicate glass. Aspects of the invention are also believed applicable in fabrication of other electronic devices and materials, with the invention only being limited by the accompanying claims appropriately interpreted in accordance with the Doctrine of Equivalents. By way of example only, example alternate constructions include antifuses and transistor gates. For example, the invention contemplates fabrication of silicon nitride layers, such as described above, to comprise at least a portion of a dielectric layer separating two antifuse electrodes. Further, methods in accordance with the invention could also be utilized to fabricate gate dielectric layers, such as layer 18 of the above-described embodiments. Further, the invention contemplates processing of dielectric layers in the context of floating gate fabrication, with the subject dielectric layer forming either the typical top and/or bottom dielectric layer(s) utilized in floating gate constructions.

Further, the invention contemplates methods of forming electronic devices incorporating a high K dielectric layer construction. In the context of this document, "high K" is intended to define a dielectric layer having a dielectric constant K of at least 15. By way of example only, such materials include $(Ba, Sr)TiO_3$, $SrTiO_3$, $(Pb, Zr)TiO_3$, $Ta_2O_5$, and $Nb_2O_5$. Nitride layers formed in accordance with the invention, such as described above, can form useful passivation and other purpose layers when formed on high K dielectric layers utilized in electronic devices incorporating high K dielectric layers and another conductive component, such as for example capacitors in antifuse constructions.

Aspects of the invention are also contemplated outside of formation of electronic devices as described in the preferred embodiments above. Specifically, reducing rotation rate of the substrate upon substantially ceasing flow of one reactant gas into the reactor, or within 1 to 2 minutes of doing so, is usable in formation of various materials over semiconductor substrates by chemical vapor deposition. The same is also applicable to flowing of an inert cooling gas through the chemical vapor deposition reactor at the conclusion of deposition. Further, doped oxide flow or reflow in a layer comprising at least two steps as described above and claimed after chemical-mechanical-polishing is also contemplated outside of fabrication of an electronic device comprising two conductive electrodes having a silicon nitride layer positioned therebetween.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an electronic device comprising:
   providing a first electrode and a doped oxide layer laterally proximate thereof over a substrate;
   forming a silicon nitride layer over both the doped oxide layer and the first electrode to a thickness of no greater than 80 Angstroms over at least the first electrode by low pressure chemical vapor deposition using feed gases comprising a silicon hydride, $H_2$ and ammonia, initial feed of the silicon hydride to the reactor commencing at a temperature of no greater than 600° C.;
   exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and forming a second electrode over the silicon dioxide layer and the first electrode.

2. The method of claim 1 wherein the $H_2$ is injected to within the reactor as an $N_2/H_2$ mix.

3. The method of claim 1 comprising depositing the silicon nitride to a thickness of no greater than 60 Angstroms.

4. The method of claim 1 comprising rotating the substrate during deposition, and commencing said rotation prior to injecting the $H_2$ to within the reactor.

5. The method of claim 1 comprising rotating the substrate during deposition, and commencing said rotation prior to injecting both the $H_2$ and the silicon hydride to within the reactor.

6. A method of forming an electronic device comprising:
providing a first electrode and a doped oxide layer laterally proximate thereof over a substrate;
low pressure chemical vapor depositing a silicon nitride layer over both the doped oxide layer and the first electrode to a thickness of no greater than 80 Angstroms over at least the first electrode using feed gases comprising a silicon hydride, $H_2$, and ammonia within a reactor, the depositing comprising increasing internal reactor temperature from below 500° C. to a maximum deposition temperature above 600° C. and starting feed of the silicon hydride into the reactor at a temperature less than or equal to 600° C.;
exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and
forming a second electrode over the silicon dioxide layer and the first electrode.

7. The method of claim 6 comprising starting feed of the silicon hydride into the reactor at a temperature less than or equal to 550° C.

8. The method of claim 6 comprising starting feed of the silicon hydride into the reactor at a temperature less than or equal to 500° C.

9. The method of claim 6 comprising starting feed of the ammonia into the reactor at a temperature less than or equal to 600° C.

10. A method of forming an electronic device comprising:
providing a first electrode and a doped oxide layer laterally proximate thereof over a substrate;
low pressure chemical vapor depositing a silicon nitride layer over both the doped oxide layer and the first electrode to a thickness of no greater than 80 Angstroms over at least the first electrode using feed gases comprising a silicon hydride, $H_2$, and ammonia within a reactor, the depositing comprising increasing internal reactor temperature from below 500° C. to a maximum deposition temperature above 600° C. using a temperature ramp rate of greater than 10° C./minute from at least 500° C. to at least 600° C.; and commencing initial feed of the silicon hydride to the reactor at a temperature of no greater than 600° C.
exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and
forming a second electrode over the silicon dioxide layer and the first electrode.

11. The method of claim 10 comprising using a temperature ramp rate of no greater than 100° C./minute from at least 500° C. to at least 600° C.

12. The method of claim 10 comprising using a temperature ramp rate of greater than 10° C./minute from a temperature below 500° C.

13. The method of claim 10 comprising using a temperature ramp rate of greater than 10° C./minute to a temperature above 600° C.

14. The method of claim 10 comprising using a temperature ramp rate of greater than 10° C./minute to the maximum deposition temperature.

15. The method of claim 10 comprising using a temperature ramp rate of greater than 10° C./minute from a temperature below 500° C. to a temperature above 600° C.

16. The method of claim 10 comprising using a temperature ramp rate of greater than 10° C./minute from a temperature below 500° C. to the maximum deposition temperature.

17. The method of claim 10 comprising commencing initial feed of the $H_2$ to the reactor at temperature of no greater than 600° C.

18. A method of forming an electronic device comprising:
providing a first electrode and a doped oxide layer laterally proximate thereof over a substrate;
low pressure chemical vapor depositing a silicon nitride layer over both the doped oxide layer and the first electrode to a thickness of no greater than 80 Angstroms over at least the first electrode while the substrate is rotating using feed gases comprising a silicon hydride, $H_2$, and ammonia within a reactor, the depositing comprising increasing internal reactor temperature from below 500° C. to a maximum deposition temperature above 600° C., starting the substrate to rotate prior to reaching the maximum deposition temperature, and commencing initial feed of the silicon hydride to the reactor at a temperature of no greater than 600° C.;
exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and
forming a second electrode over the silicon dioxide layer and the first electrode.

19. The method of claim 18 comprising starting the substrate to rotate prior to reactor temperature reaching 600° C.

20. The method of claim 18 comprising commencing initial feed of the silicon hydride to the reactor upon starting the substrate rotating.

21. The method of claim 18 comprising starting the substrate to rotate prior to reactor temperature reaching 600° C., and commencing initial feed of the silicon hydride to the reactor upon starting the substrate rotating.

22. The method of claim 18 comprising commencing initial feed of the $H_2$ to the reactor at a temperature of no greater than 600° C.

23. The method of claim 18 comprising commencing initial feed of the $H_2$ to the reactor upon starting the substrate rotating.

24. A method of forming an electronic device comprising:
providing a first electrode and a doped oxide layer laterally proximate thereof over a substrate;
low pressure chemical vapor depositing a silicon nitride layer over both the doped oxide layer and the first electrode to a thickness of no greater than 80 Angstroms over at least the first electrode while the substrate is rotating using feed gases comprising a silicon hydride, $H_2$, and ammonia within a reactor, the depositing comprising increasing internal reactor temperature from below 500° C. to a maximum deposition temperature of at least 640° C., starting the substrate to rotate prior to reaching 640° C., and commencing initial feed of the silicon hydride to the reactor at a temperature of no greater than 600° C.;
exposing the substrate with silicon nitride layer to oxidizing conditions comprising at least 700° C. to form a silicon dioxide layer over the silicon nitride layer, with the thickness of silicon nitride over the doped oxide layer being sufficient to shield oxidizable substrate material beneath the doped oxide layer from oxidizing during the exposing; and
forming a second electrode over the silicon dioxide layer and the first electrode.

25. The method of claim 24 comprising starting the substrate to rotate prior to reactor temperature reaching 600° C.

26. The method of claim 24 comprising commencing initial feed of the silicon hydride to the reactor upon starting the substrate rotating.

27. The method of claim 24 comprising starting the substrate to rotate prior to reactor temperature reaching 600° C., and commencing initial feed of the silicon hydride to the reactor upon starting the substrate rotating.

28. The method of claim 24 further comprising commencing initial feed of the $H_2$ to the reactor at a temperature of no greater than 600° C.

29. The method of claim 24 comprising commencing initial feed of the $H_2$ to the reactor upon starting the substrate rotating.

* * * * *

UNITED STATES PATENT AND TRADEMARK OFFICE
CERTIFICATE OF CORRECTION

PATENT NO. : 7,217,614 B2 Page 1 of 1
APPLICATION NO. : 10/338523
DATED : May 15, 2007
INVENTOR(S) : Thakur It is certified that error appears in the above-identified patent and that said Letters Patent is hereby corrected as shown below:

In column 9, line 61, in Claim 10, after "600° C." delete ";".

In column 9, line 63, in Claim 10, after "600° C." insert -- ; --.

In column 10, line 27, in Claim 17, after "at" insert -- a --.

In column 12, line 16, in Claim 28, after "claim 24" delete "further".

Signed and Sealed this

Thirteenth Day of November, 2007

JON W. DUDAS
*Director of the United States Patent and Trademark Office*